US006866720B2

(12) United States Patent
Kim et al.

(10) Patent No.: US 6,866,720 B2
(45) Date of Patent: Mar. 15, 2005

(54) MASK FOR FABRICATING DISPLAY PANEL

(75) Inventors: Chang Nam Kim, Seoul (KR); Dong Uk Shin, Kyongsangnam-do (KR); Jong Min Kim, Kyongsangnam-do (KR)

(73) Assignee: LG Electronics Inc., Seoul (KR)

( * ) Notice: Subject to any disclaimer, the term of this patent is extended or adjusted under 35 U.S.C. 154(b) by 361 days.

(21) Appl. No.: 09/993,521

(22) Filed: Nov. 27, 2001

(65) Prior Publication Data

US 2002/0062785 A1 May 30, 2002

(30) Foreign Application Priority Data

Nov. 28, 2000 (KR) ......................................... 2000-71327

(51) Int. Cl.[7] .............................................. H05B 33/10
(52) U.S. Cl. ........................ 118/504; 118/301; 427/282
(58) Field of Search ................................. 118/721, 504, 118/213, 301, 505; D18/26; 345/43; 427/259, 282; 313/402

(56) References Cited

U.S. PATENT DOCUMENTS 6,146,489 A * 11/2000 Wirth ........................... 156/280

FOREIGN PATENT DOCUMENTS

JP         2001237073        *  2/2000   ........... H05B/33/10

OTHER PUBLICATIONS

JPO computer translation of JP 20011237073, Metal mask for manufacturing organic EL display panel, has several unit metal masks which are respectively supported by edges of openings provided in base material area, Feb. 24, 2000.*

* cited by examiner

Primary Examiner—Richard Crispino
Assistant Examiner—Michelle Acevedo Lazor
(74) Attorney, Agent, or Firm—Fleshner & Kim, LLP

(57) ABSTRACT

Mask for fabricating a large sized display panel, wherein a main frame having a plurality of holes is fabricated, and sub-masks are fitted in the holes in the main frame relevant to a size, and forms of patterns to be fabricated, thereby eliminating sagging and shadowing, and being suitable for fabricating large sized, or mass production of panels.

29 Claims, 7 Drawing Sheets

MASK FOR FABRICATING DISPLAY PANEL

This application claims the benefit of the Korean Application No. P2000-71327 filed on Nov. 28, 2000, which is hereby incorporated by reference.

BACKGROUND OF THE INVENTION

1. Field of the Invention

The present invention relates to a mask for fabricating a large sized display panel.

2. Background of the Related Art

Recently, a size of the display panel becomes the larger as high quality, and high resolution of a picture are pursued. However, there are many technical difficulties in fabrication of such a large sized display panel, of which is a difficulty of fabrication process caused by the mask used in fabrication of the large display panel, i.e., a size of the mask is required to be large for fabrication of the large sized display panel.

Figure 1A:
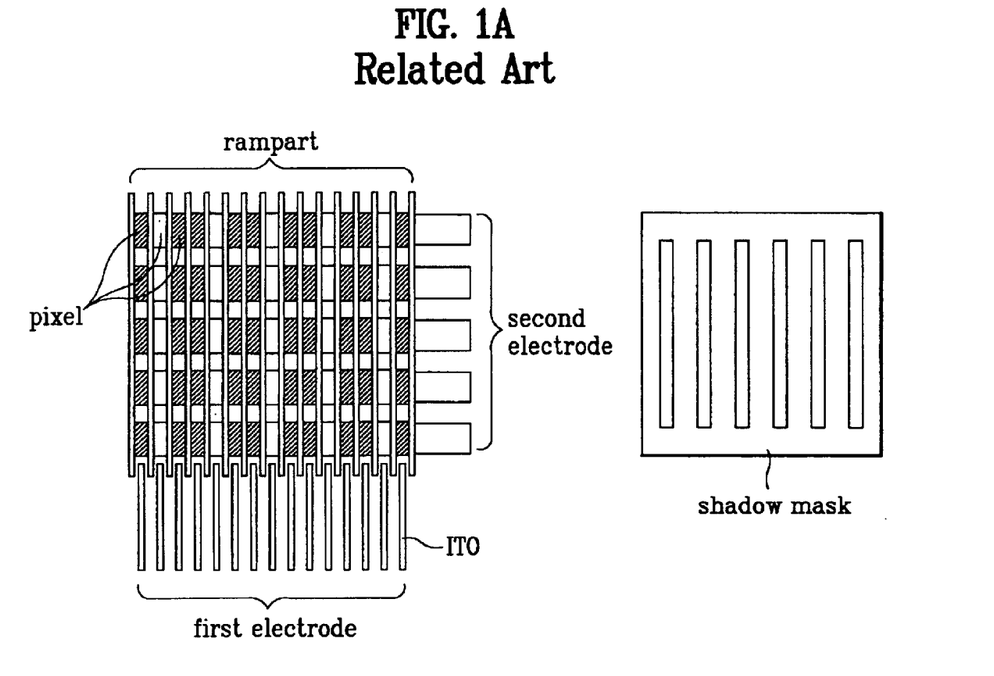
FIGS. 1A and 1B illustrate a strip type, and a delta type shadow masks, respectively.
Figure 1B:
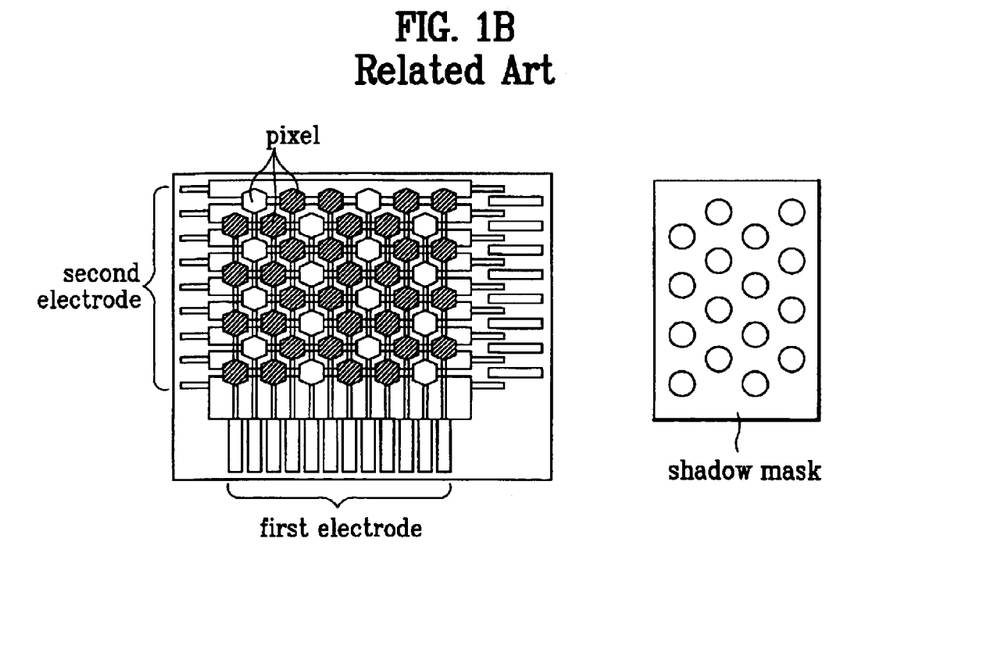

However, the fabrication of such a large sized mask, not only requires much time and cost, but also has a disadvantage of poor accuracy in fabrication process caused by sagging of the mask. For an example, for fabrication of an organic EL display panel, a shadow mask of a strip type as shown in FIG. 1A, or a delta type as shown in FIG. 1B, is required for deposition of luminescent material layers of R, G, B pixels invariably. However, those masks are liable to sag due to patterns on the masks, to damage barriers and the like formed on the panel during deposition of the material, particularly, the strip type shadow mask in which rectangular elongated patterns are formed has a greater sag than the delta type shadow mask.

Figure 2:
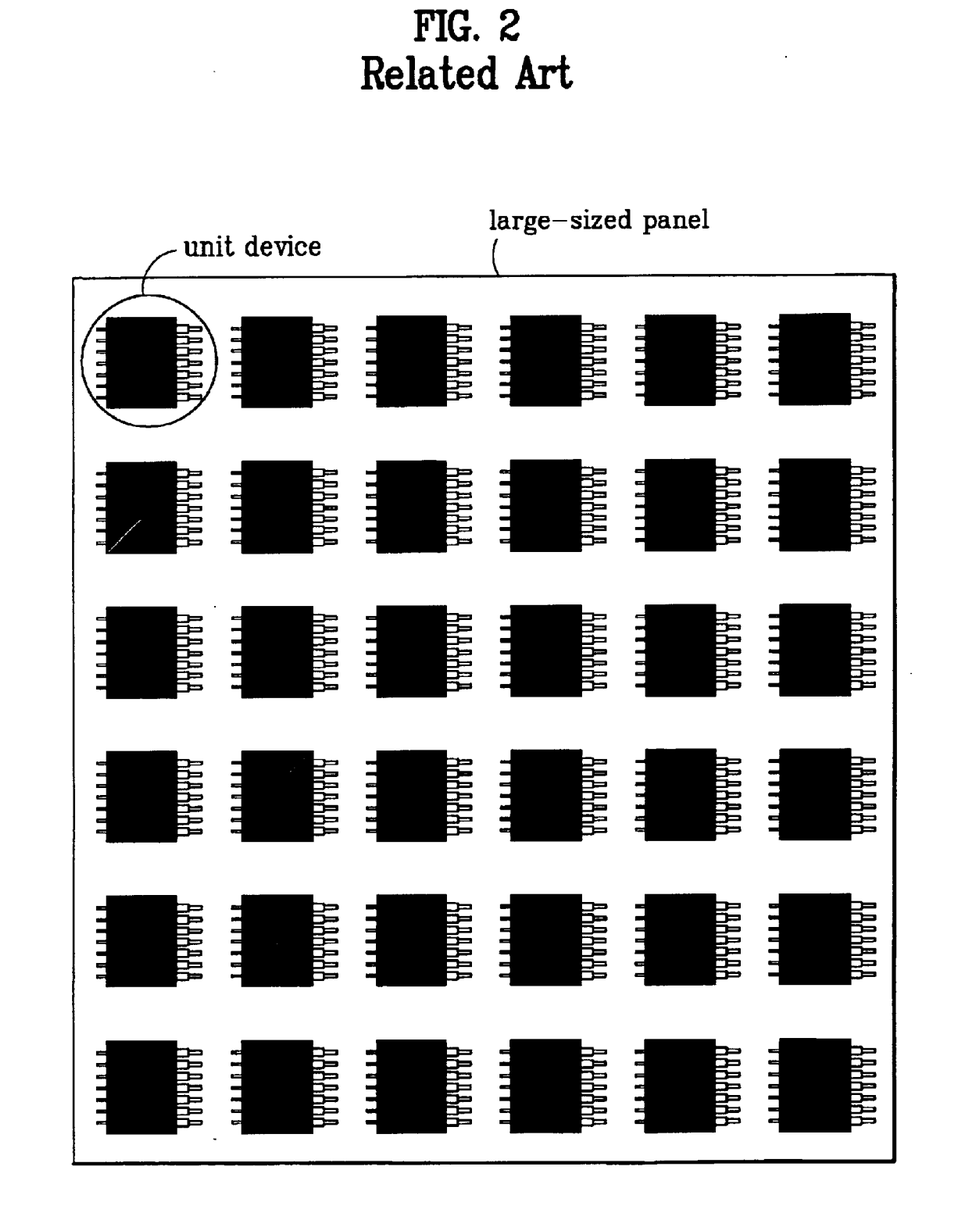
FIG. 2 illustrates a large sized panel for use in a mass production of unit devices.
Figure 3:
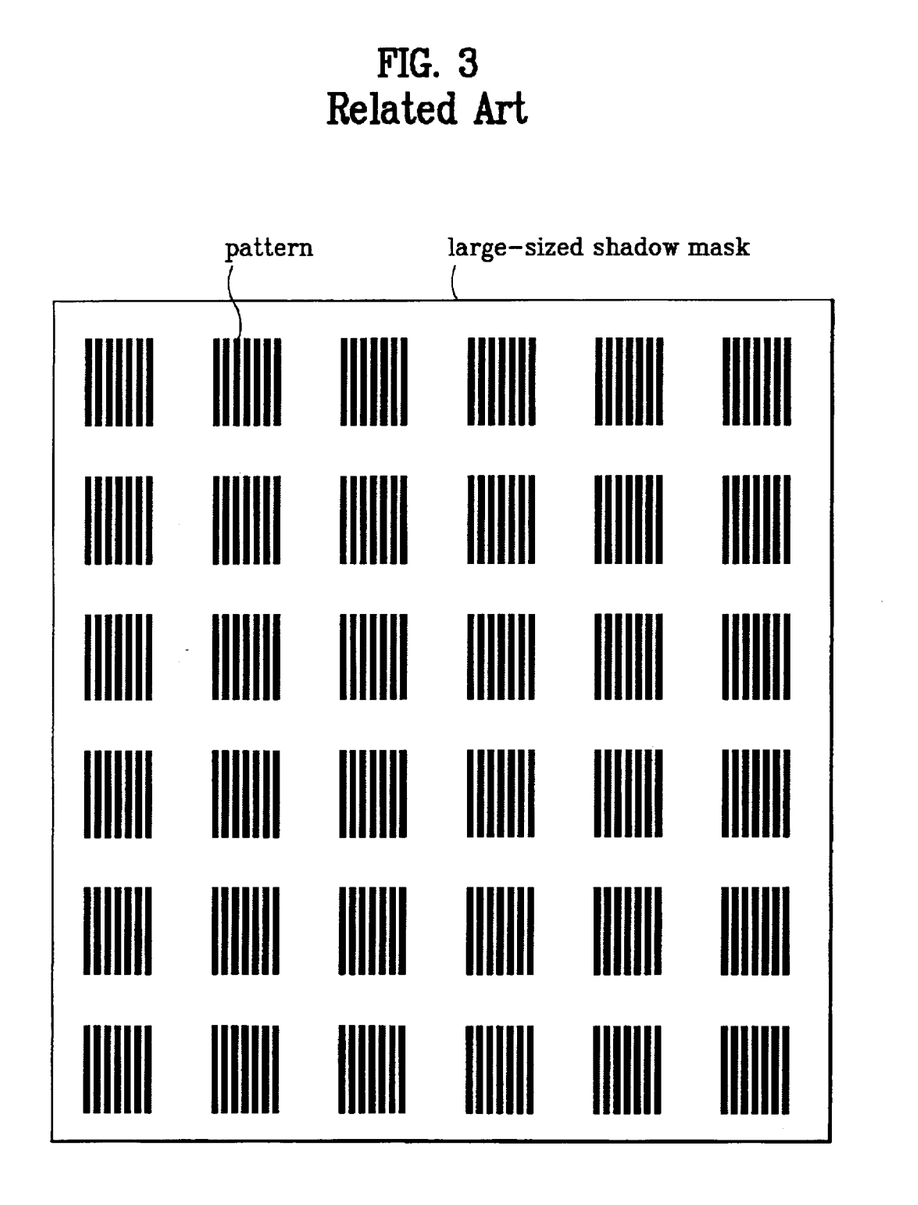
FIG. 3 illustrates a related art large sized shadow mask for use with the large sized panel in FIG. 2.

Referring to FIG. 2, the sagging of the shadow mask becomes more greater when unit devices are mass produced on a large sized substrate, because, as shown in FIG. 3, the size of the shadow mask is required to be large the same as the substrate, and many patterns are formed on the shadow mask.

To cope with this problem, a tension is applied to the shadow mask, which however causes deformation of the mask patterns, i.e., distortion, or elongation, that makes accuracy of the deposition process poor, to limit a size of the mask.

Moreover, even if a shadow mask with no sagging is used, metal stripes on the mask are susceptible to vibration even by a weak impact, to give damage to the barriers of the panel. That is, since a gap between the shadow mask and the panel is very small, the vibration to the mask gives damage to the barriers at the highest positions among the barriers formed on the panel, which may cause shorts between pixels in fabrication of second electrodes.

However, one attempt to provide a larger gap between the shadow mask and the panel for preventing the damage to the barrier results in deposition of the materials at inaccurate positions due to a shadow effect that causes another problem.

SUMMARY OF THE INVENTION

Accordingly, the present invention is directed to a mask for fabricating a display panel that substantially obviates one or more of the problems due to limitations and disadvantages of the related art.

An object of the present invention is to provide a mask for fabricating a display panel, which has no sagging, or shadowing.

Another object of the present invention is to provide a mask for fabricating a display panel, which is suitable for fabrication of a large sized, or mass production of, display panel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. The present invention suggests to fabricate a main frame having a plurality of holes, and fitting sub-masks in the holes respectively according to panel sizes and patterns intended to fabricate, for providing a mask suitable for fabrication of large sized, or mass production of, display panels that have neither sagging, nor shadowing.

Figure 4:
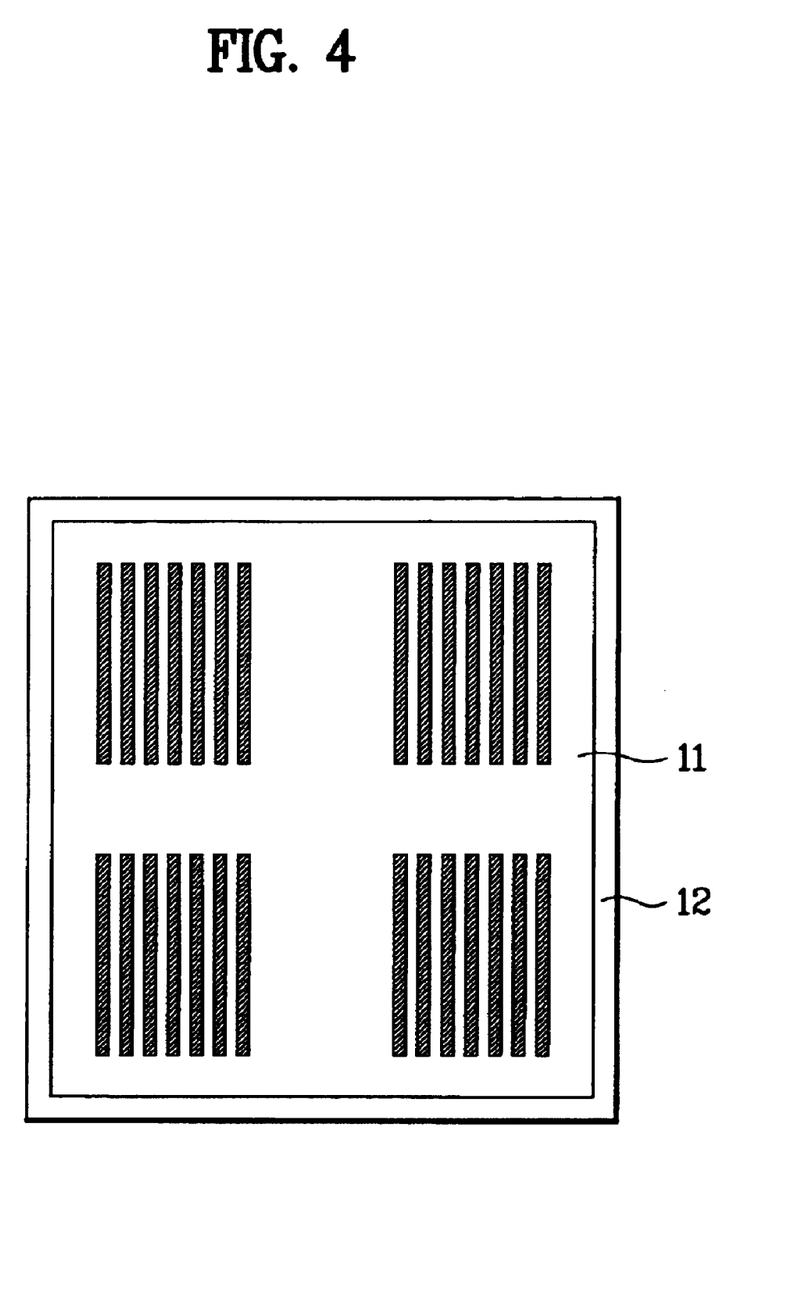
FIG. 4 illustrates a sub-mask in accordance with a preferred embodiment of the present invention.

FIG. 4 illustrates a sub-mask in accordance with a preferred embodiment of the present invention.

Referring to FIG. 4, the sub-mask in accordance with a preferred embodiment of the present invention includes a sub-mask 11 having at least one pattern, and a sub-frame 12 fixed to edges around the sub-mask 11 for fastening the sub-frame. The sub-mask 11 may have a pattern formed thereon varied as a designer desires, or a plurality of patterns, within a limit the patterns cause no sagging of the sub-mask 11.

The sub-frame 12 fixed around the sub-mask 11 may be formed of metal, polymer, inorganic material, or the like, which is formable, and strong against bending, such as aluminum, nickel, tungsten, titanium, iron, copper, or an alloy of them in metal, or plastic in polymer, or glass, or wafer in inorganic material.

Figure 5A:
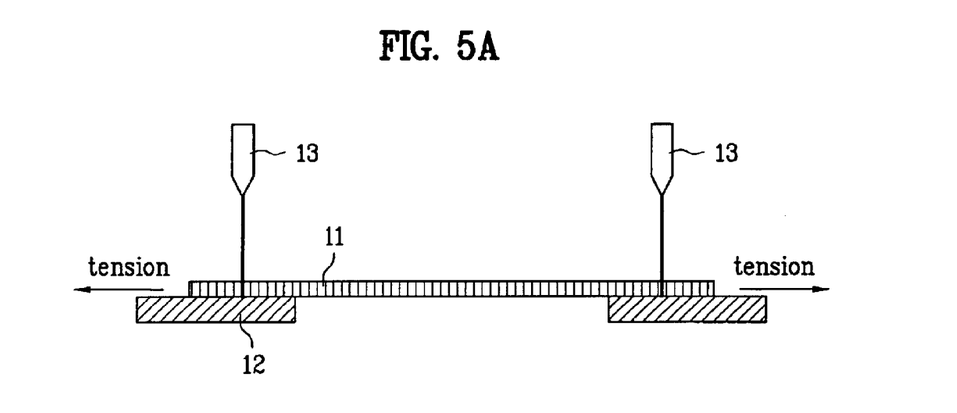
FIGS. 5A–5C illustrate sections each showing a method for fastening a sub-mask and a sub-frame in accordance with a preferred embodiment of the present invention.
Figure 5B:
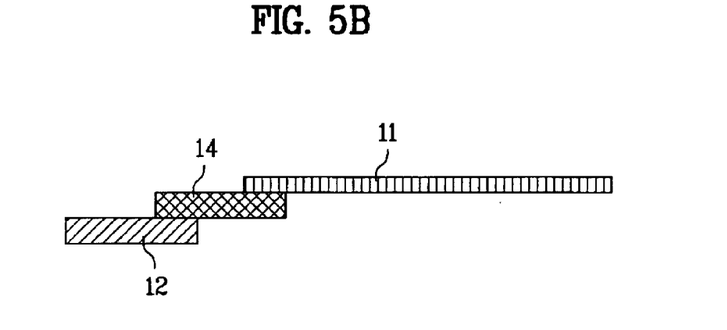
Figure 5C:
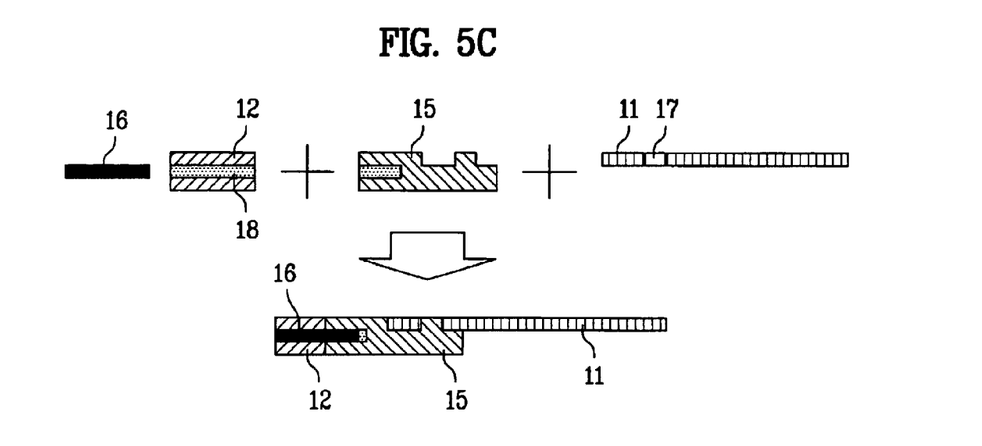

There may be a variety of methods for fixing the sub-mask to the sub-frame 12, of which three methods as shown in FIGS. 5A–5C are used.

Referring to FIG. 5A, in a first method, the sub-mask 11 is mounted on the sub-frame 12, tension is applied to the sub-mask 11 uniformly for preventing sagging of the sub-mask 11, and the sub-mask 11 is fixed to the sub-frame 12 by using a laser 13.

Referring to FIG. 5B, in a second method, a piece of fiber 14 like a net is attached around the sub-mask 11 with adhesive, and tension is applied to the fiber 14 for fixing to the sub-frame 12. The fiber 14 is attached to the sub-mask 11 and the sub-frame 12 with adhesive.

Referring to FIG. 5C, a jig 15 may be used. That is, holes 17 are formed in edge region of the sub-mask 11, lateral holes 18 passed through sides of the sub-frame 12 are formed, the sub-mask 11 is fastened to the jig 15 by using the holes 17, and the sub-frame 12 is fastened to the jig 15 with screws 16, to fix the sub-mask 11 to the sub-frame 12.

Figure 6:
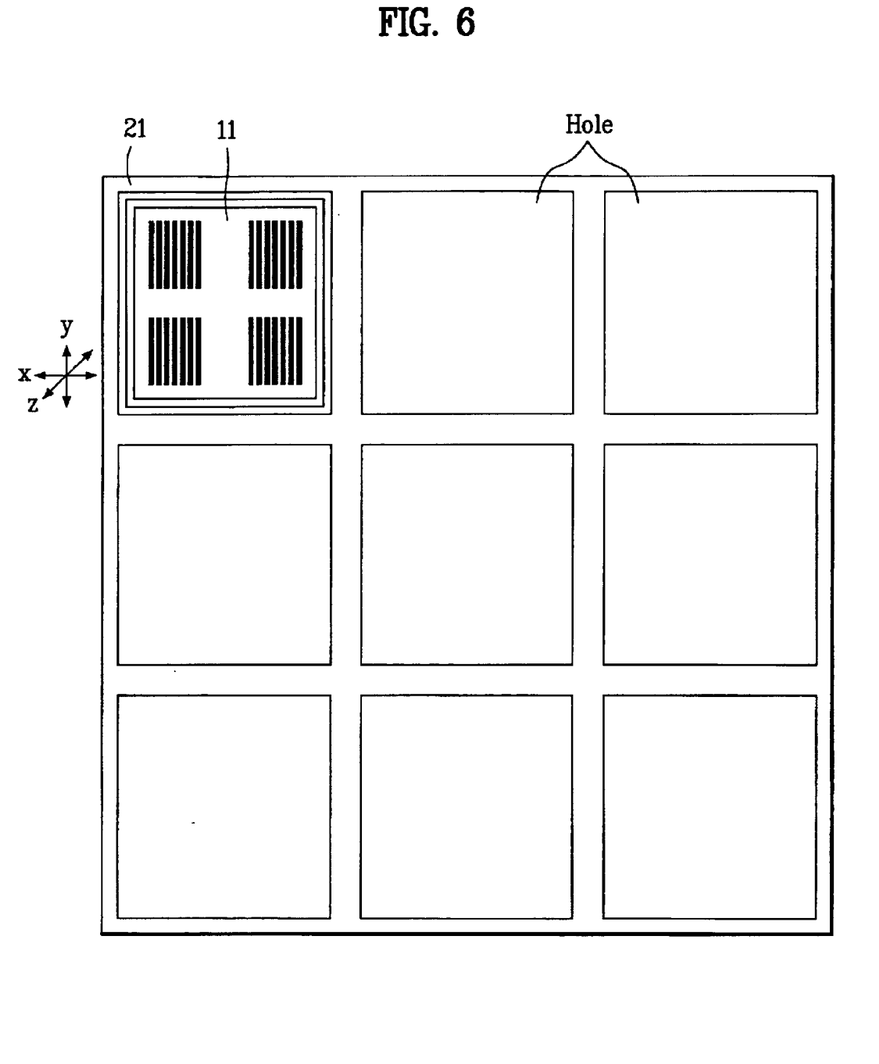
FIG. 6 illustrates a main frame of a large sized mask the sub-mask in FIG. 4 is placed thereon; and, FIG. 7 illustrates a large sized mask in accordance with a preferred embodiment of the present invention.

Referring to FIG. 6, when the sub-mask fabricated thus is mounted on the main frame 21, a mask for fabricating a large display panel can be fabricated. In this instance, the sub-mask 11 is fitted to every hole in the main frame 21.

A number of holes in the main frame 21 are dependent on a number of devices to be fabricated, and the number of holes in the main frame 21 is required to be more than the number of the sub-mask 11 to be mounted on the main frame 21, because there may be a case when the sub-masks 11 are mounted only in holes at required positions according to forms of devices a designer intends to fabricate.

The main frame 21 is fabricated to have a size equal to, or greater than a panel size a material is to be deposited thereon. The sub-mask 11 is fabricated to be movable in the hole in the main frame 21 in up and down, and left and right directions, for fine adjustment of the sub-mask 11 to align the patterns on the sub-mask 11 at an exact positions, by using MEMS (Microelectric Machine System).

Alike the sub-frame 12, the main frame 21 may be formed of metal, polymer, or inorganic material, or the like, which are formable and strong against bending, such as aluminum, tungsten, titanium, iron, copper, or an alloy of them as the metal, plastic as the polymer, or glass or wafer as the inorganic material.

Figure 7:
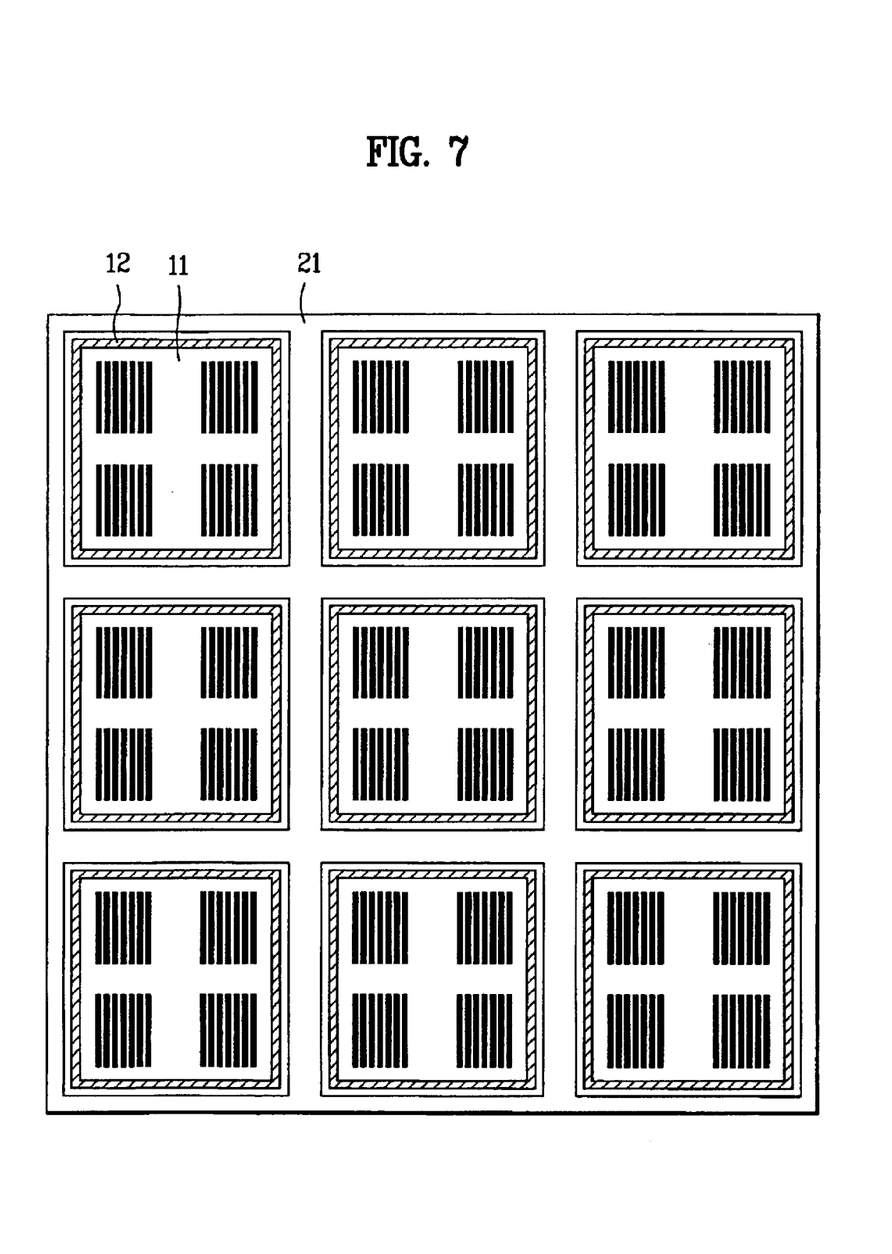

Referring to FIG. 7, upon mounting the sub-masks 11 on the main frame 21 by the foregoing methods, fabrication of a large sized mask is completed. According to this, since the large sized mask of the present invention is supported on the sub-frame 12 partly, and on the main frame 21 wholly, the large sized mask is not involved in sagging, or shadowing like the related art. Moreover, since the large sized mask of the present invention permits individual mounting/dismounting of the sub-masks 11 to/from the holes in the main frame 21, fabrication of devices according to intention of the designer and fabrication of a large sized device are easy, and mass production is favorable.

As one embodiment, the steps of a process for fabricating an organic EL display panel by using the mask of the present invention will be explained.

At first, a large sized transparent substrate is provided, first electrode stripes, first electrode pads, and second electrode pads are formed on the substrate, and barriers are formed between luminescent regions perpendicular to the first electrodes. Then, a large sized mask of the present invention is placed on the substrate, and fine adjustment of positions of the sub-masks is made for accurate alignment of the patterns on the sub-mask with the luminescent regions on the substrate. A red luminescent layer is deposited on a red luminescent region of the substrate, and the large sized mask is moved. A green luminescent layer is deposited on a green luminescent region of the substrate, and the large sized mask is moved, again. Then, a blue luminescent layer is deposited on a blue luminescent region of the substrate. Next, a second electrode material is deposited on an entire surface of the substrate, to form the second electrode stripes in the luminescent region. Finally, a protection film is formed on the second electrode, encapsulation is conducted, to complete fabrication of the organic EL display panel.

Thus, because the mask for fabricating a display panel of the present invention is not involved in sagging, or shadowing, the mask of the present invention can improve a fabrication accuracy, and reliability, and is suitable for fabrication of large sized panel, or mass production, thereby dropping a fabrication cost. Moreover, the possibility of mounting/dismounting of mask makes maintenance of the mask easy.

It will be apparent to those skilled in the art that various modifications and variations can be made in the mask for fabricating a display panel of the present invention without departing from the spirit or scope of the invention. Thus, it is intended that the present invention cover the modifications and variations of this invention provided they come within the scope of the appended claims and their equivalents.

What is claimed is:

1. A mask assembly for a display panel, comprising:
   a plurality of sub-masks each having at least one pattern; and
   a main frame having a plurality of holes formed therein configured to support the sub-masks, wherein each of the sub-masks is positioned in a corresponding one of the plurality of holes so as to be movable in up and down, and left and right directions.

2. The mask assembly as claimed in claim 1, wherein each sub-mask is fixed to a sub-frame.

3. The mask assembly as claimed in claim 2, wherein the sub-frame and the sub-mask are attached using one of a laser, adhesive, or a connecting device.

4. The mask assembly as claimed in claim 3, wherein the sub-frame and the sub-mask are attached using a laser.

5. The mask assembly as claimed in claim 3, wherein the sub-frame and the sub-mask are attached using an adhesive.

6. The mask assembly as claimed in claim 3, wherein the sub-frame and the sub-mask are attached using a connecting device.

7. The mask assembly as claimed in claim 2, wherein the sub-frame and the main frame are formed of metal, polymer, or an inorganic material.

8. The mask assembly as claimed in claim 7, wherein the metal is aluminum, nickel, tungsten, titanium, iron, copper, or an alloy thereof, the polymer is plastic, and the inorganic material is glass, or wafer.

9. The mask assembly as claimed in claim 7, wherein the sub-frame and the main frame are formed of metal.

10. The mask assembly as claimed in claim 7, wherein the sub-frame and the main frame are formed of polymer.

11. The mask assembly as claimed in claim 7, wherein the sub-frame and the main frame are formed of an inorganic material.

12. The mask assembly as claimed in claim 2, wherein a number of the holes formed in the main frame corresponds to a number of the subframes.

13. The mask assembly as claimed in claim 1, wherein a number of the holes in the main frame is equal to or greater than a number of the sub-masks.

14. The mask assembly as claimed in claim 1, wherein a size of the main frame is equal to or greater than a panel to which the main frame is configured to be attached.

15. A display panel comprising the mask assembly of claim 1.

16. A mask assembly for a display panel having a luminescent region at every perpendicular crossing position of first electrode stripes and second electrode stripes, the mask assembly comprising:

a plurality of sub-masks each having at least one pattern;

a sub-frame fixed around edges of the sub-masks; and a main frame having a plurality of holes formed therein and configured to support the plurality of sub-masks each fixed to a respective sub-frame, wherein each of the sub-masks is positioned in a corresponding one of the plurality of holes so as to be movable in up and down, and left and right directions.

17. The mask assembly as claimed in claim 16, wherein the sub-frame and the sub-masks are attached using one of laser, adhesive, or a connecting device.

18. The mask assembly as claimed in claim 17, wherein the sub-frame and the sub-mask are attached using a laser.

19. The mask assembly as claimed in claim 17, wherein the sub-frame and the sub-mask are attached using an adhesive.

20. The mask assembly as claimed in claim 17, wherein the sub-frame and the sub-mask are attached using a connecting device.

21. The mask assembly as claimed in claim 16, wherein the sub-frame and the main frame are formed of metal, polymer, or an inorganic material.

22. The mask assembly as claimed in claim 21, wherein the metal is aluminum, nickel, tungsten, titanium, iron, copper, or an alloy thereof, the polymer is plastic, and the inorganic material is glass, or wafer.

23. The mask assembly as claimed in claim 21, wherein the sub-frame and the main frame are formed of metal.

24. The mask assembly as claimed in claim 21, wherein the sub-frame and the main frame are formed of polymer.

25. The mask assembly as claimed in claim 21, wherein the sub-frame and the main frame are formed of an inorganic material.

26. A display panel comprising the mask assembly of claim 16.

27. The display panel as claimed in claim 26, wherein the display panel comprises an organic EL display panel.

28. A mask assembly for a display panel, comprising:

a plurality of sub-masks; and a main frame having a plurality of holes formed therein configured to support the sub-masks, wherein each of the sub-masks is positioned in a corresponding one of the plurality of holes.

29. A display panel comprising the mask assembly of claim 28.

* * * * *